United States Patent
Massies et al.

(10) Patent No.: US 8,470,618 B2
(45) Date of Patent: Jun. 25, 2013

(54) METHOD OF MANUFACTURING A LIGHT-EMITTING DIODE HAVING ELECTRICALLY ACTIVE AND PASSIVE PORTIONS

(75) Inventors: Jean Massies, Valbonne (FR); Benjamin Damilano, Nice (FR)

(73) Assignee: Centre National de la Recherche Scientifique—CNRS-, Paris (FR)

( * ) Notice: Subject to any disclaimer, the term of this patent is extended or adjusted under 35 U.S.C. 154(b) by 0 days.

(21) Appl. No.: 12/882,868

(22) Filed: Sep. 15, 2010

(65) Prior Publication Data

US 2011/0045623 A1 Feb. 24, 2011

Related U.S. Application Data

(62) Division of application No. 12/225,039, filed as application No. PCT/FR2007/050898 on Mar. 9, 2007.

(30) Foreign Application Priority Data

Mar. 13, 2006 (FR) ...................................... 06 50842

(51) Int. Cl.
*H01L 21/00* (2006.01)
(52) U.S. Cl.
USPC .............................................. 438/22; 438/77
(58) Field of Classification Search
USPC ..................................................... 438/22, 47
See application file for complete search history.

(56) References Cited

U.S. PATENT DOCUMENTS

| 4,801,993 A | 1/1989 | Ankri et al. |
| 4,818,079 A * | 4/1989 | Maserjian ..................... 359/299 |
| 5,907,165 A | 5/1999 | Hamm et al. |
| 6,163,038 A * | 12/2000 | Chen et al. ..................... 257/103 |
| 6,165,859 A | 12/2000 | Hamm et al. |
| 6,445,009 B1 | 9/2002 | Grandjean et al. |

(Continued)

FOREIGN PATENT DOCUMENTS

| EP | 1 211 737 | 6/2002 |
| FR | 2 772 187 | 6/1999 |
| FR | 2 796 657 | 1/2001 |
| FR | 2 803 433 | 7/2001 |

OTHER PUBLICATIONS

Damilano, B. et al.; "Monolithic White Light Emitting Diodes Based on InGaN/GaN Multiple-Quantum Wells;" The Japan Society of Applied Physics, vol. 40, Pt. 2, No. 9A/B, Sep. 15, 2001; pp. L918-L920.

(Continued)

*Primary Examiner* — David Vu
*Assistant Examiner* — Caleb Henry
(74) *Attorney, Agent, or Firm* — Harness, Dickey & Pierce, P.L.C.

(57) ABSTRACT

The disclosure relates to a making a matrix of III-V nitride, the matrix including at least an active first portion through which an electrical current passes and at least a passive second portion through which no electrical current passes, the matrix including at least a first zone forming a first quantum confinement region made of a III-V nitride, the first zone being positioned in the active first portion, and at least a second zone forming a second quantum confinement region made of III-V nitride, such that the second zone is positioned to the passive portion of the matrix.

24 Claims, 7 Drawing Sheets

U.S. PATENT DOCUMENTS

| | | | |
|---|---|---|---|
| 6,611,539 B2* | 8/2003 | Ledentsov et al. | 372/20 |
| 6,730,943 B2 | 5/2004 | Massies et al. | |
| 6,903,387 B2 | 6/2005 | Hase | |
| 7,141,445 B2* | 11/2006 | Sugawara et al. | 438/41 |
| 7,217,959 B2* | 5/2007 | Chen | 257/100 |
| 7,223,998 B2* | 5/2007 | Schwach et al. | 257/86 |
| 7,242,030 B2* | 7/2007 | Wang et al. | 257/89 |
| 7,323,721 B2 | 1/2008 | Liao et al. | |
| 7,593,436 B2* | 9/2009 | Ledentsov et al. | 372/20 |
| 7,645,626 B2* | 1/2010 | Ha et al. | 438/46 |
| 7,767,307 B2 | 8/2010 | Semond et al. | |
| 7,785,991 B2 | 8/2010 | Joblot et al. | |
| 2002/0041148 A1* | 4/2002 | Cho et al. | 313/499 |
| 2002/0105004 A1 | 8/2002 | Hori et al. | |
| 2002/0139984 A1 | 10/2002 | Sugawara et al. | |
| 2003/0006430 A1* | 1/2003 | Shibata et al. | 257/200 |
| 2004/0214401 A1 | 10/2004 | Krueger et al. | |
| 2004/0227144 A1 | 11/2004 | Hon | |
| 2005/0067627 A1* | 3/2005 | Shen et al. | 257/89 |
| 2005/0082543 A1* | 4/2005 | Alizadeh et al. | 257/79 |
| 2006/0039437 A1 | 2/2006 | Albrecht et al. | |
| 2006/0054905 A1* | 3/2006 | Schwach et al. | 257/89 |
| 2006/0124917 A1* | 6/2006 | Miller et al. | 257/13 |
| 2006/0145137 A1* | 7/2006 | Wang et al. | 257/14 |
| 2010/0001319 A1 | 1/2010 | Pélouard et al. | |
| 2010/0025653 A1* | 2/2010 | Soh et al. | 257/13 |

OTHER PUBLICATIONS

Haase, M.A. et al.; "II-IV Semiconductor Color Converters for Efficient Green, Yellow, and Red Light Emitting Diodes.;" Applied Physics Letters 96, 2010; pp. 231116-1-231116-3.

Damilano, B. et al.; "Monolithic White Light Emitting Diodes Using a (Ga,In)N/GaN Multiple Quantum Well Light Converter;" Applied Physics Letters 93, 2008; pp. 101117-1-101117-3.

Kalliakos, S. et al.; "Photoluminescence Energy and Linewidth in GaN/A1N Stackings of Quantum Dot Planes;" Journal of Applied Physics, American Institute of Physics, New York, US, vol. 96, No. 1, XP012067946, ISSN: 0021-8979 (the whole document) Jul. 1, 2004; pp. 180-185.

Goodhue, W.D., et al., "Monolithic two-dimensional surface-emitting strained-layer InGaAs/AlGaAs and AlInGaAs/AlGaAs diode laser arrays with over 50% differential quantum efficiencies"; Applied Physics Letters 59 (6):632-634, Aug. 5, 1991.

Lee, Sung-Nam, et al., "Monolithic InGaN-based white light-emitting diodes with blue, green, and amber emissions"; Applied Physics Letters 92, 081107 (1-3) (2008).

Qi, Y.D., et al., "Dual wavelength InGaN/GaN multi-quantum well LEDs grown by metalorganic vapor phase epitaxy"; Journal of Crystal Growth 272 (2004) 333-340.

Yamada, Motokazu, et al., "Phosphor Free High-Luminous-Efficiency White Light-Emitting Diodes Composed of InGaN Multi-Quantum Well";Jpn. J. Applied Physics vol. 41 (2002) pp. L246-L248, Part 2, No. 3A, Mar. 1, 2002.

Damilano, B., et al.; "Monolithic white light emitting diodes using a (Ga,In)N/GaN multiple quantum well light converter"; Journal of Applied Physics Letters; Aug. 25, 2008; 3 pages; vol. 93; Issue 101117-1; American Institute of Physics.

Martin, R. W., et al.; "Exciton localization and the Stokes' shift in InGaN epilayers"; Journal of Applied Physics Letters; Jan. 11, 1999; pp. 263-265; vol. 74; No. 2; American Institute of Physics.

Krames, Michael R., et al.; "Status and Future of High-Power Light-Emitting Diodes for Solid-State Lighting"; Journal of Display Technology; Jun. 2007; pp. 160-175; vol. 3; No. 2.

Massies, Jean, et al.; "Diodes electroluminescentes blanches pour l'eclairage"; Images de la Physique; pp. 1-6; and English machine translation thereof.

\* cited by examiner

METHOD OF MANUFACTURING A LIGHT-EMITTING DIODE HAVING ELECTRICALLY ACTIVE AND PASSIVE PORTIONS

CROSS-REFERENCE TO RELATED APPLICATIONS

This is a divisional of U.S. Ser. No. 12/225,039, filed on Sep. 12, 2008, which is a National Phase Entry of International Application Serial No. PCT/FR2007/050898, filed on Mar. 9, 2007, which claims priority to French Application Serial No. 06/50842, filed Mar. 13, 2006; all of which are incorporated by reference herein.

BACKGROUND AND SUMMARY

The present invention relates to the field of light-emitting diodes, and more particularly the field of monolithic light-emitting diodes.

Such diodes are, for example, known from the application U.S. Pat. No. 6,445,009, wherein a diode is disclosed, which comprises a device including a substrate whereon a matrix is positioned, which comprises at least a stack of quantum wells of the GaN or GaInN type emitting in the visible spectrum at an ambient temperature in a layer of AlN or GaN respectively. In the application U.S. Pat. No. 6,445,009, a system of (Al, Ga, In)N or III-V nitrides materials is used, and these are semiconductors having a wide bandgap, and which have the characteristic of being able to emit in the whole visible spectrum. For example, a white light is obtained by mixing in the active zone of the diode, i.e. in the zone through which the current of the diode passes, quantum wells or InGaN/(Al)GaN quantum dots emitting in the blue and other ones emitting in the yellow.

Besides, it is also admitted that III-V nitrides are efficient materials for the production of monolithic light-emitting diodes. However, it is known that the output of emissions through electric pumping varies according to the emitted wavelength and more particularly, that the output in the blue is twice as good as the output in the yellow. This is the reason why the diodes emitting in the blue are the most widely used on the market today. The light output in the diode emitting in the blue and in the yellow is thus limited by the properties of the quantum dots or the quantum wells emitting in the yellow.

A first aim of the present invention is not to be limited by light outputs through an electric injection at different wavelengths. In addition, it is known that in the electric injection diodes using quantum dots or quantum wells, the distribution of the electrons and the holes in the quantum dots or in the quantum wells is modified as a function of the voltage applied to the diode. The colour emitted may thus vary with the intensity of the electric current. This characteristic may be useful if diodes which can change colours are desired, but it is a drawback for the emission in the white when the purpose is lighting.

A second aim of the present invention is thus to avoid the variation of the colour emission as a function of the intensity of the current of the diode. In the field of non monolithic diodes, white diodes are widely used, which are composed of a first monolithic part emitting in the blue (blue diode), above which a phosphorescent material is positioned which absorbs a part of the blue photons emitted by the blue diode and reemits yellow photons, the combination of such two lights giving a white light.

However, such two-part diodes of the standard blue diode-phosphor type have, on the one hand, the drawback that the phosphor positioned above the blue diode results in a deterioration of the general performances of the device over time. This leads to a deterioration of the white light over time and to a limitation of the life of the white LED with respect to a standard blue LED. On the other hand, it should be noted that the manufacturing of such a white LED requires a first conventional step of epitaxial growth of the blue LED and an additional step of the deposition of phosphor. Such additional step of the deposition thus involves higher production costs.

Another aim of the present invention is thus to provide a white diode through epitaxial growth only, i.e. a monolithic diode. Another aim of the present invention is thus to provide a white diode, the emission properties of which are stable over time.

The application US 2003/006430 which discloses a diode comprising Si- or Se-doped GaN layers making it possible to obtain an emission in the yellow. It is also known that in such layers, the emission is caused by deep levels resulting from crystalline defects. The quantum efficiency of this type of layer is thus limited. Besides, such deep levels emit at a wavelength which is fixed in the yellow. The diode of the above-mentioned document does not make it possible to obtain a diode which can emit in the whole visible spectrum by combining the colours between the light emitted in the active zone and the light emitted in the passive zone.

The application 2002/0139984 is also known, which describes a diode comprising a stack of semi-conductive layers in the passive zone of the diode. Such a stack of layers is made so as to compose a mirror for the wavelength emitted by the active zone, in order to increase the photons extraction efficiency. Besides, such layers must have an emission wavelength very close to that of the active zone for example less than 0.9 times half the width of the spectrum. Thus, for example for a blue LED at 450 nm and a width of 20 nm, the emission wavelength of such layers is comprised between 450 and 459 nm. The result is that the function of the semi-conductive layers in the above-mentioned document is not to denature the colour of the active zone, so that for example a blue LED remains blue, while increasing the extraction efficiency by using the mirror properties of the stack of quantum wells. Such a diode thus does not make it possible to make colour combinations between the light emitted by the active zone and the light emitted by the passive zone.

Another aim of the invention is to provide a diode which can potentially emit in the whole visible spectrum and more particularly when it is excited by a blue LED. At least one of these aims is reached according to the present invention by a device comprising a matrix made of III-V nitride, said matrix comprising at least an active first portion through which an electric current passes and at least a passive second portion through which no electric current passes, said matrix comprising at least a first zone comprising a first stack of quantum wells or planes of quantum dots of III-V nitride, said first zone being positioned in said active first portion and at least a second zone comprising a second stack of quantum wells or planes of quantum dots of III-V nitride, characterised in that said second zone is positioned in said passive portion of said matrix. Thanks to the stacks of quantum wells or quantum dots respectively positioned in the active portion and the passive portion of the device, it is possible to control efficiently the lights emitted by the first zone and the second zone in order to generate, at the device output, a light which can spread on the whole visible spectrum.

According to the invention, the first zone comprising a first stack of quantum wells or planes of quantum dots of III-V nitride forms a first quantum confinement and a second zone comprising a second stack of quantum wells or planes of quantum dots of III-V nitride forms a second quantum confinement. By positioning the second quantum confinement zone in the passive portion of the monolithic matrix, the present invention solves the problems relating to the difference in the emission as a function of the currents which go through two different quantum zones in the known diodes. Thus, in the device according to the present invention, the second quantum confinement zone positioned in the passive zone will in fact be optically pumped by the photons emitted by the first quantum confinement zone, the latter being electrically pumped by the current of the diode passing in the active zone.

The optical pumping of the second zone in the passive portion of the matrix of the device thus makes it possible to avoid the drawbacks connected to the electric pumping, and more particularly the dependence of the emission on the current intensity. Besides, the monolithic constitution of the matrix comprising the passive zone and the active zone in one III-V nitride material, makes it possible to obtain the device according to the invention with only one step of epitaxial growth. The distribution of the III-V nitride elements in the matrix is carried out according to the invention, so that said first zone forms a quantum confinement and that the second zone forms a quantum confinement, i.e. the part of the matrix between such zones forms a quantum gate between such zones. This is obtained, in a manner known per se, by selecting the III-V nitride materials as a function of the bandgaps of such materials.

In order to be able to adapt, in particular, the colour of the light emitted by the first zone, said at least one first zone is able to emit photons at least a first wavelength through an electric injection by said current passing in said active zone, said at least first wavelength being determined by the dimensions of said first stack of quantum wells or planes of quantum dots of III-V nitride and the composition of said first stack of quantum wells or planes of quantum dots of III-V nitride. Similarly, said at least second zone is able to emit photons at least a second wavelength through an optical pumping by said photons emitted by said first zone, said at least one second wavelength being determined by the dimensions of said second stack of quantum wells or planes of quantum dots of III-V nitride and the composition of said second stack of quantum wells or planes of quantum dots of III-V nitride.

In order to diffuse a white light and more particularly for lighting applications, said first zone and said second zone are selected so that the combination of the light signal corresponding to the photons at said wavelength and the light signal corresponding to the photons of said second wavelength diffuses a substantially white light. In order to reach a good output of light emissions, said at least one first zone is able to emit photons in the blue through an electric injection by said current passing in said active zone. In this case, in order to obtain a white light at the output of the device, said at least one second zone is able to emit photons in the yellow by an optical pumping by said photons emitted by said first zone. The emission in the yellow makes it possible to use only one stack of quantum wells or planes of quantum dots.

According to another embodiment, which makes it possible to improve the colour temperature and the colour rendering index while obtaining a white light at the device output, said at least one second zone is able to emit photons in the green and in the red by an optical pumping by said photons emitted by said first zone. According to an alternative solution of the invention, said first zone is composed of a stack of quantum wells of the InGaN/GaN type. In such embodiment of the invention, said second zone is composed of a stack of planes of quantum dots of the GaN/AlN type. In order to allow the passage of the current towards the first active zone while making the quantum confinement of the first active zone, said matrix made of III-V nitride includes a third conductive portion which forms a quantum gate for said first zone.

The invention also relates to a light-emitting diode comprising a device such as previously described and means for generating said current, said means for generating said current being so arranged as to define said active first portion through which said electric current passes and said passive second portion through which no electric current passes.

BRIEF DESCRIPTION OF THE DRAWINGS

The invention will be better understood upon reading the following detailed description and referring to the appended figures wherein.

DETAILED DESCRIPTION

Figure 1:
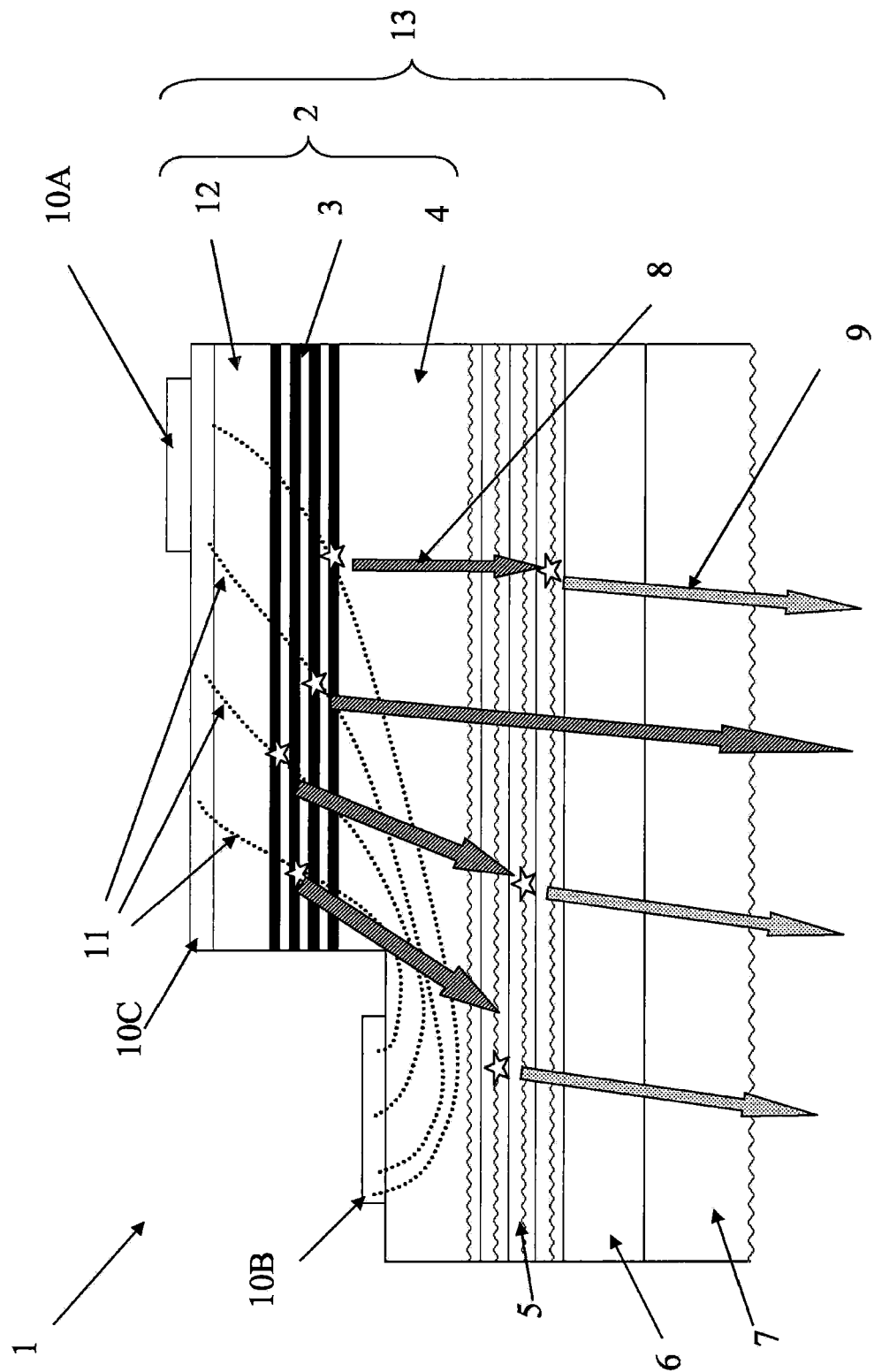
FIG. 1 shows an exemplary light-emitting diode according to the present invention.

As illustrated in FIG. 1, a light-emitting diode 1 according to the invention includes a substrate 7 on which a matrix 13 is formed which comprises various portions which will be described in further details hereinunder. The matrix 13 first includes an active portion conducting electric current and more particularly current lines 11. Such electric current is generated by current generating means, for example, by metal contacts in the form of a positive terminal 10A and a negative terminal 10B and a semitransparent contact 10C. The active portion of the matrix 13 is thus defined as the portion of the matrix through which the current emitted by the current generating means 10A, 10B and 10C passes. Such active portion comprises a first zone 3 positioned in the active portion so as to be gone through by the current lines 11. Such zone 3 corresponds to a quantum confinement able to be electrically pumped by the current emitted by the current generating means 10A, 10B and 10C. It will be called hereinunder an electric injection zone. Such electric injection zone 3 is for example composed of a stack of InGaN/GaN quantum wells. The characteristics of such electric injection zone 3 are selected so that the electric injection made by the current enables the emission of photons, for example blue photons, as shown by the arrow 8. Such electric injection zone 3 is limited by a n-doped GaN conductive part 4 and a p-doped GaN part 12. The function of such parts 4 and 12 is to conduct the current through the confined zone 3. The current generation means 10A, 10B and 10C, the active portion and the quantum confinement electric injection zone 3 generally form a blue diode 2, the structure of which is known per se.

According to the invention, the matrix 13 also comprises a passive portion which cannot be reached by the electric field lines 11. According to the invention, a quantum confinement zone 5 is positioned in this passive portion. Such zone 5 is, for example, composed of a stack of GaN/AlN quantum dots. This zone 5 may be optically pumped by the photons emitted by the electric injection zone 3. The zone 5 will be called hereinunder an optical pumping zone.

Thanks to the optical pumping by the photons emitted by the electric injection zone 3, the optical pumping zone 5 emits photons at a wavelength which is different from that it receives. More precisely, in a manner known for the optical pumping, the length of the photons emitted by the optical pumping zone 5 is greater than the wavelength of the excitation photons it receives from the electric injection zone 3. The passive portion also comprises an AlN zone 6 having the function of a quantum gate for the GaN quantum dots of the optical pumping zone. The height of the GaN quantum dots of the optical pumping zone 5 is selected so that the photons 9 emitted by this zone have a wavelength substantially in the yellow. The number of planes of quantum dots is selected so that some blue photons 8 pass through the optical pumping zone 5. The optical pumping zone z then has the function of a blue/yellow passive converter. The combination of the blue photons 8 emitted by the electric injection zone 3 and the yellow photons 9 emitted by the optical pumping zone 5 then enable the generation of a substantially white light at the output of a transparent substrate 7, for example made of sapphire.

Figure 2:
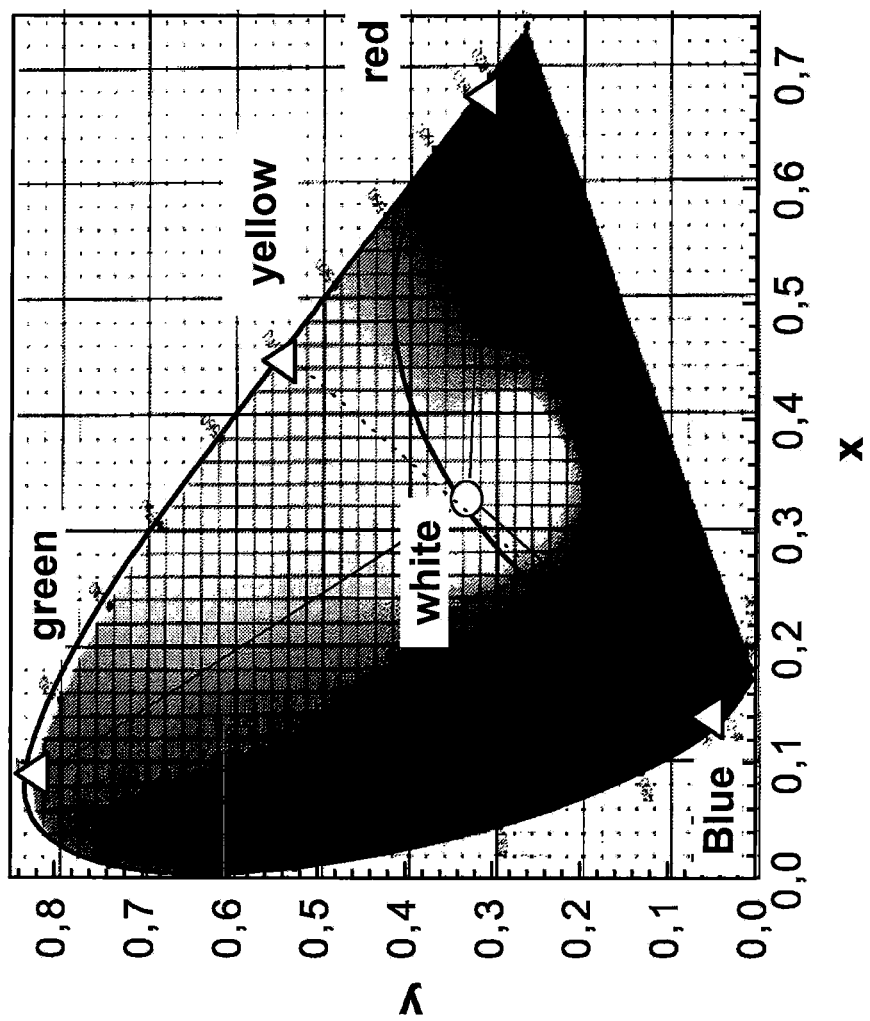
FIG. 2 shows a chromatic diagram for the selection of the components in a light-emitting diode according to FIG. 1.

The emissions properties of the electric injection zone 3 and the optical pumping zone 5 may be adapted to the desired colour by modifying the dimensions and compositions of the quantum wells and the quantum dots of at least one of these zones. More particularly, all the combinations of colours such as given on the chromatic diagram in FIG. 2 are possible. For lighting purposes, a combination of colours generating a white light will be chosen, but it should be noted that the coloured light may result from the combination of wavelengths emitted by the first electric injection zone 3 and the second optical pumping zone 5 as previously described. More particularly, in order to improve the colour temperature and the colour rendering index of the colours obtained, the combination of a first stack emitting in the red and the second stack emitting in the green, with these two stacks still being, according to the invention, positioned in a passive zone of the matrix 13 of the diode 1, may be preferred to a stack of quantum dots emitting in the yellow.

It is of course understood that various combinations of the III-V nitride materials may be used in the constitution of the matrix 13 according to the invention, while respecting the obligations of quantum confinement for the electric injection 3 and optical pumping 5 zones. The III-V nitride are GaN, InN, AlN and the alloys thereof and can be noted (Ga, In, Al)—N. More particularly, GaN quantum dots can be used in AlN or GaInN quantum dots can be used in AlN or GaInN quantum dots can be used in AlGaInN. GaInN/GaN quantum wells can also be used. It is also known that all such combinations comply with the conditions of the quantum confinement. Using only III-V nitrides for the matrix 13 makes it possible to make a diode 1 with only one step of epitaxial growth and to take advantage of the correct light emission properties of such materials.

Now, we are giving a detailed description of an exemplary structure and dimension of the matrix 13 according to the invention in the table 1 herein under which shows the succession of layers in the matrix 13 according to the invention.

TABLE 1

| Layer composition | Typical thickness (nm) | Reference |
|---|---|---|
| GaN: Mg | 200 | 12 |
| $Al_{0.1}Ga_{0.9}N$: Mg | 10 | 12 |
| GaN | 7.5 | 3 |
| $Ga_{0.85}In_{0.15}N$ quantum wells | 2.5 | 3 |
| GaN: Si | 2,000 | 4 |
| GaN nid | 1,000 | 4 |
| AlN | 10 | 5 |
| Plane of GaN quantum dots | 3 | 5 |
| AlN | 300 | 6 |
| GaN buffer layer | 30 | 7 |
| Sapphire Substrate | 350,000 | 7 |

In the table 1 hereabove, the references of the third column correspond to the references of FIG. 1. The first electric injection zone 3 is composed of five stacks of $Ga_{0.85}In_{0.15}N$ quantum wells and one layer of GaN. The second optical pumping zone is composed of twenty stacks of planes of GaN quantum dots and one layer of AlN. The exemplary dimension and composition given in the table 1 make it possible to emit in the blue through an electric injection of zone 3, and the emission in the yellow by the optical pumping of zone 5.

Figure 3:
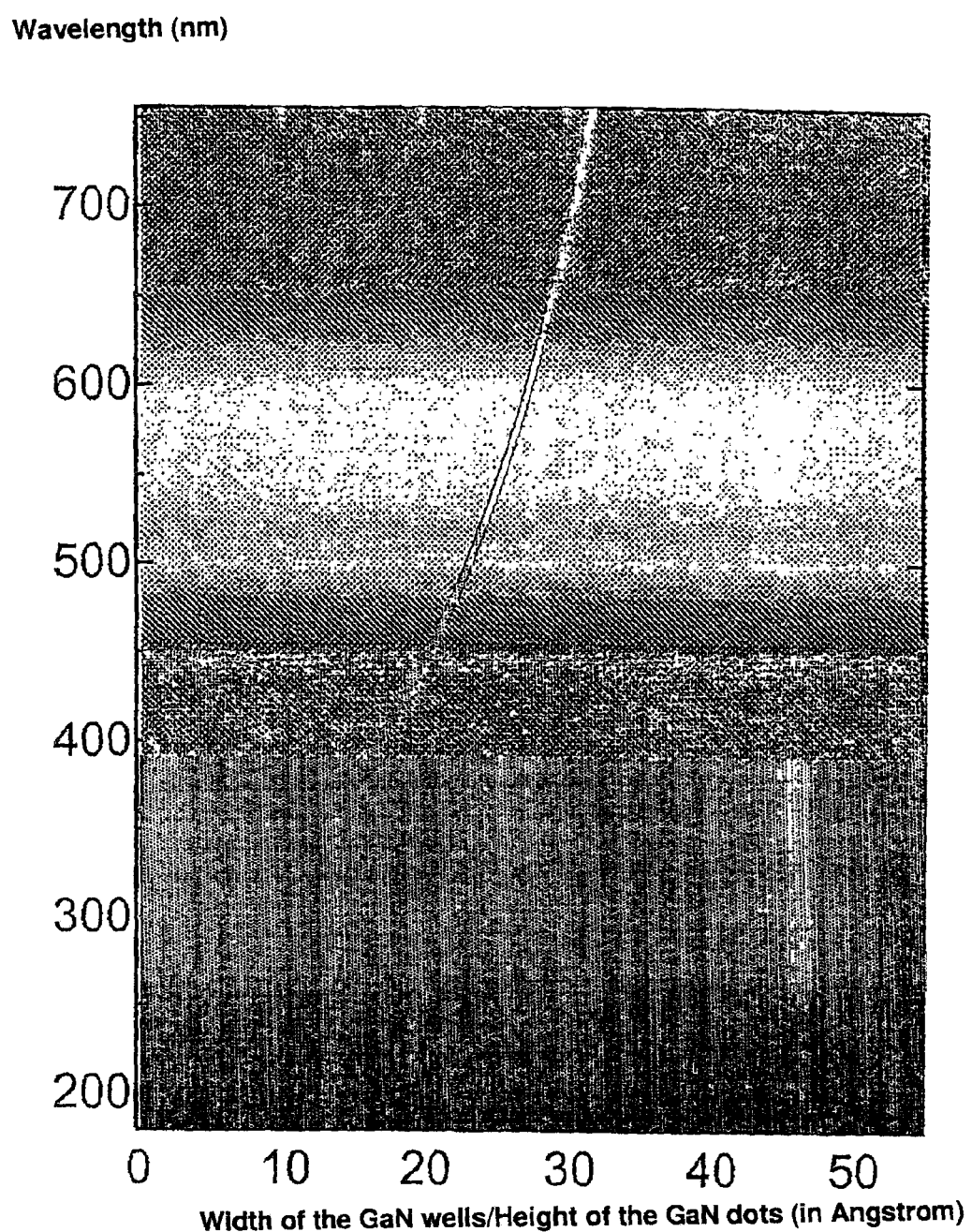
FIG. 3 shows the emission wavelength in nanometers in an AlN/GaN/AlN quantum well or for an AlN/GaN/AlN quantum dot which can be used in a device such as the one shown in FIG. 1.
Figure 4:
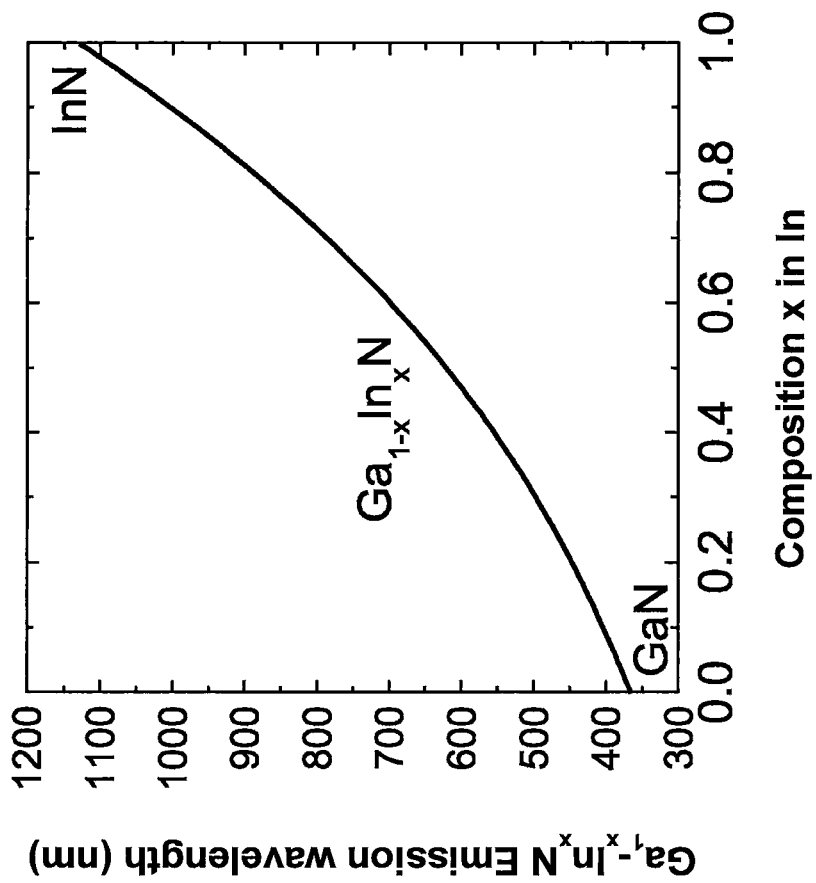
FIG. 4 shows the emission wavelength for a $Ga_{1-x}In_xN$ thick layer which can be used in the device of FIG. 1.
Figure 5:
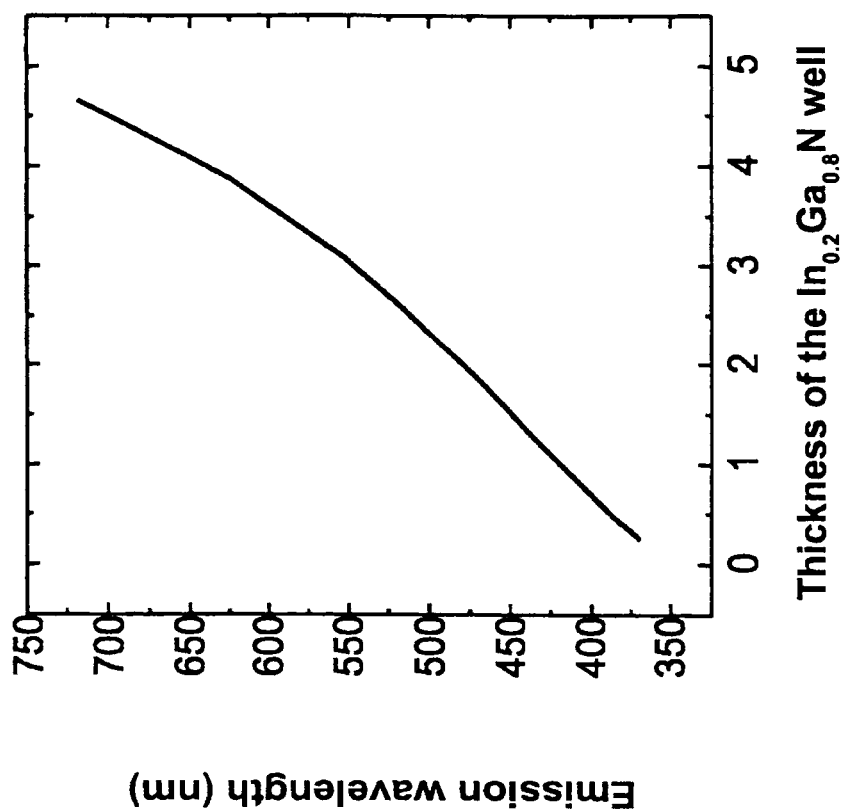
FIG. 5 shows the emission wavelength for $Ga_{0.8}In_{0.2}N$ wells which can be used in the device of FIG. 1.

Besides, other combinations of compositions and dimensions may be carried out by the person skilled in the art, more particularly using emission graphics of the FIGS. 3, 4 and 5. FIG. 3 shows the emission wavelength in nanometer in an AlN/GaN/AlN quantum well or for an AlN/GaN/AlN quantum dot. The emission wavelength depends on the width of the quantum well or the dimensions of the quantum dots, more particularly the height of the quantum dots.

FIG. 4 shows the emission wavelength for a $Ga_{1-x}In_xN$ thick layer without any quantum effect. Such wavelength more particularly depends on the x component in In. Eventually, FIG. 5 shows the emission wavelength for $Ga_{0.8}In_{0.2}N$ quantum wells in a GaN matrix.

Figure 6:
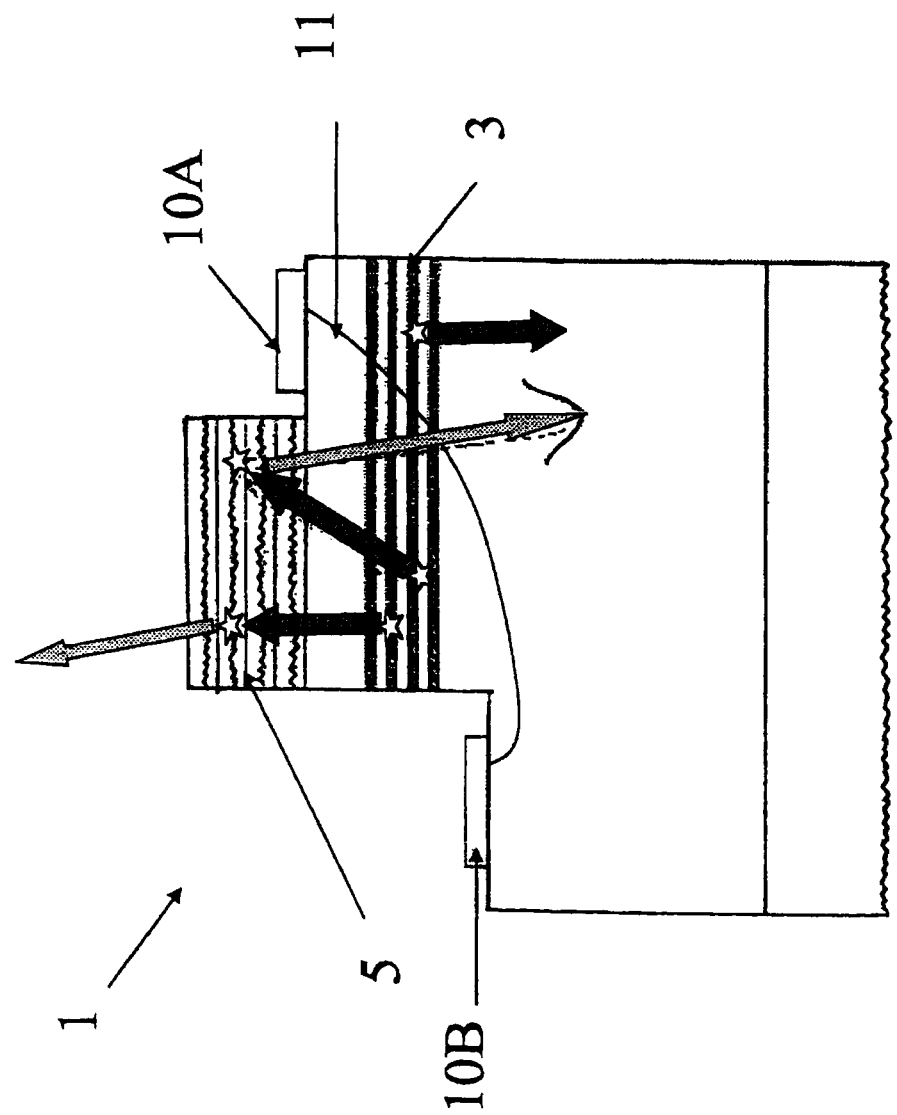
FIG. 6 shows another exemplary embodiment of a light-emitting diode according to the invention.

Now, various alternative solutions of the invention will be described. As illustrated in FIG. 6, the quantum of confinement optical pumping zone 5 may also be positioned above the quantum confinement electric injection zone 3 in the direction of the epitaxial growth. In such configuration, the metal contacts 10C have been eliminated so as to direct the field lines 11 while avoiding an upper passive portion containing the optical pumping zone 5. In operation, the electric injection zone 3 is electrically pumped by the current according to the current lines 11 so as to emit photons, for example in the blue, to the top of the device. Such photons then optically pump the optical pumping zone 5 which re-emits the photons, for example in the yellow. The light obtained through the combination of such lights may then, as previously mentioned, be a white light.

Figure 7:
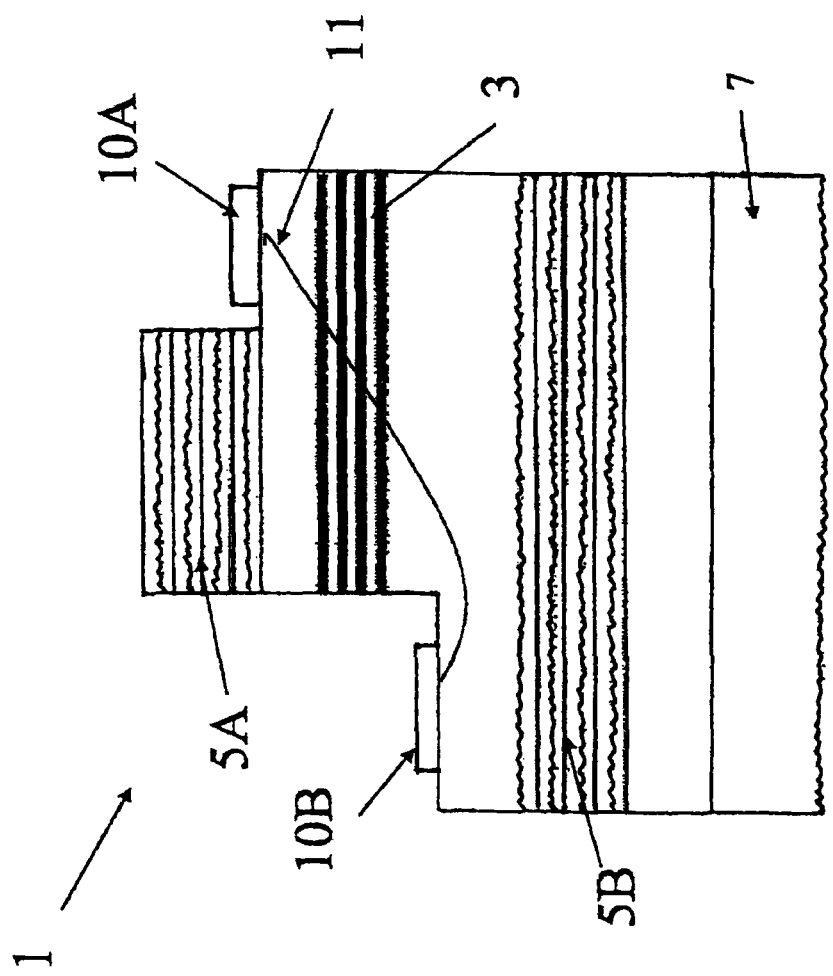
FIG. 7 shows still another exemplary embodiment of the light-emitting diode according to the invention.

As illustrated now in FIG. 7, it is also possible to combine both embodiments such as previously described in one diode 1 comprising a first quantum confinement optical pumping zone 5A and a second quantum confinement optical pumping zone 5B, both being positioned in a passive portion of the matrix of diode 1. The first optical pumping zone 5A is, for example, positioned above the electric injection zone 3, and the second optical pumping zone 5B is positioned thereunder. As mentioned previously, the current generation means 10A and 10B are so arranged that no current goes through the passive portion of the matrix. Both optical pumping zones 5A and 5B may be chosen for emitting photons at the same wavelength or at different wavelengths. According to another not shown embodiment, it is also possible to position several quantum confinement electric injection zones 3 in the active portion of the matrix 13 gone through by an electric current.

In every embodiment, it should be noted that the person skilled in the art will have the possibility of adapting the parameters of the thickness of the optical or electrical pumping zones, so as to obtain the light emission requested by combining the photons emitted by both optical and electrical pumping zones. He will also be able to obtain a white light by using the teaching relating to the combination of colours such as illustrated in FIG. 2. The combination of an emission of the first zone 3 in the blue and planes of quantum dots emitting in the red and in the green more particularly makes it possible to obtain a correct colour temperature as well as a correct colour rendering index.

The invention claimed is:

1. A method of manufacturing a light-emitting diode, the method comprising:
   (a) making a matrix in an epitaxial manner from a material comprising III-V nitride;
   (b) creating an active portion of the matrix through which electricity passes;
   (c) creating a passive portion of the matrix through which electricity passage is deterred, wherein the active portion and the passive portion are made in a monolithic and single piece manner from the material comprising III-V nitride; and
   (d) creating zones of at least one of: (i) a stack of quantum wells, and (ii) planes of quantum dots, the zones being in the active and passive portions.

2. The method of claim 1, further comprising:
   (a) creating the zone in the active portion to emit photons of at least a first wavelength in response to electricity in the active portion; and
   (b) creating the zone in the passive portion to emit photons of at least a second wavelength, different than the first wavelength, due to optical pumping by the photons emitted by the zone in the active portion.

3. The method of claim 2, wherein the second wavelength corresponds to yellow light.

4. The method of claim 2, wherein the first wavelength corresponds to blue light.

5. The method of claim 2, wherein the wavelengths of the zones diffuse white light.

6. The method of claim 1, further comprising using quantum wells of an InGaN/GaN type in the zone in the active portion.

7. The method of claim 1, further comprising using quantum dots of a GaN/AlN type in the zone in the passive portion.

8. The method of claim 1, further comprising:
   (a) attaching a positive, metallic electrical terminal;
   (b) attaching a negative, metallic electrical terminal; and
   (c) attaching a semitransparent electrical contact.

9. A method of manufacturing a light-emitting diode, the method comprising:
   (a) making an electrically active area and an electrically passive area in a material comprising III-V nitride, wherein the active area and the passive area are made in a monolithic manner from the material comprising III-V nitride;
   (b) creating quantum confinement in the active area;
   (c) creating quantum confinement in the passive area;
   (d) creating a quantum gate between the areas; and
   (e) selecting quantum features for the active and passive areas so that a combination of a light signal corresponding to photon wavelengths diffuses a substantially temporally stable white light.

10. The method of claim 9, wherein the feature selected for the active area comprises quantum wells.

11. The method of claim 9, wherein the feature selected for the active area comprises an InGaN/GaN type material.

12. The method of claim 9, wherein the feature selected for the passive area comprises quantum dots.

13. The method of claim 9, wherein the feature selected for the passive area comprises a GaN/AlN type material.

14. The method of claim 9, further comprising:
   (a) creating the zone in the active area to emit photons of at least a first wavelength in response to electricity in the active area; and
   (b) creating the zone in the passive area to emit photons of at least a second wavelength, different than the first wavelength, due to optical pumping by the photons emitted by the zone in the active area.

15. The method of claim 9, further comprising:
   (a) attaching a positive, metallic electrical terminal;
   (b) attaching a negative, metallic electrical terminal; and
   (c) attaching a semitransparent electrical contact.

16. The method of claim 9, further comprising epitaxially growing the entire matrix.

17. A method of making a light-emitting device, the method comprising:
   (a) epitaxially growing an entire III-V nitride matrix in a monolithic manner;
   (b) creating an electrically conductive portion of the matrix including photon emitting features;
   (c) creating an electrically resistant portion of the matrix including photon emitting features pumped by the photons emitted from the conductive portion; and
   (d) creating the matrix to generate light in the whole visible spectrum.

18. The method of claim 17, further comprising using quantum wells for at least one of the features.

19. The method of claim 17, further comprising using quantum dots for at least one of the features.

20. The method of claim 17, further comprising using InGaN/GaN type material for at least one of the features.

21. The method of claim 17, further comprising using GaN/AlN type material for at least one of the features.

22. The method of claim 17, further comprising epitaxially creating a quantum gate between the conductive and resistant portions of the matrix.

23. The method of claim 17, further comprising attaching a positive electrical terminal to a section of the matrix opposite the resistant portion, with the conductive portion therebetween.

24. The method of claim 17, further comprising attaching a positive electrical terminal to a section of the matrix on the same side of the conductive portion as the resistant portion.

* * * * *